(12) United States Patent
Tateishi et al.

(10) Patent No.: US 7,602,578 B2
(45) Date of Patent: *Oct. 13, 2009

(54) SERVO WRITER AND SERVO WRITING PROCESS

(75) Inventors: Seiji Tateishi, Odawara (JP); Toru Nakao, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 224 days.

This patent is subject to a terminal disclaimer.

(21) Appl. No.: 11/548,476

(22) Filed: Oct. 11, 2006

(65) Prior Publication Data

US 2008/0186620 A1    Aug. 7, 2008

Related U.S. Application Data

(63) Continuation of application No. 10/921,185, filed on Aug. 19, 2004, now Pat. No. 7,142,388.

(30) Foreign Application Priority Data

Aug. 20, 2003    (JP)    ............................. 2003-296343

(51) Int. Cl.
G11B 5/584    (2006.01)
G11B 5/02    (2006.01)
G11B 5/03    (2006.01)

(52) U.S. Cl. .................... 360/77.12; 360/55; 360/67

(58) Field of Classification Search ................. None
See application file for complete search history.

(56) References Cited

U.S. PATENT DOCUMENTS

| | | | |
|---|---|---|---|
| 4,689,514 A * | 8/1987 | Kondoh et al. | 310/323.21 |
| 4,874,633 A | 10/1989 | Komatsu et al. | |
| 4,996,609 A | 2/1991 | Joannou | |
| 5,689,384 A * | 11/1997 | Albrecht et al. | 360/77.12 |
| 5,838,520 A | 11/1998 | Hirayama | |
| 6,078,463 A | 6/2000 | Pahr | |
| 6,347,016 B1 | 2/2002 | Ishida et al. | |
| 6,700,729 B1 * | 3/2004 | Beck et al. | 360/76 |
| 6,970,312 B2 | 11/2005 | Yip et al. | |
| 7,187,511 B2 | 3/2007 | Nakao | |
| 2002/0164504 A1 | 11/2002 | Masaki | |

(Continued)

FOREIGN PATENT DOCUMENTS

JP    8-30942 A    2/1996

*Primary Examiner*—Joseph H Feild
*Assistant Examiner*—Daniell L Negrón
(74) *Attorney, Agent, or Firm*—Sughrue Mion, PLLC (57) ABSTRACT

A servo writer according to the present invention is a servo writer which writes a servo signal on a servo band of a magnetic tape. It comprises a magnetic tape driving system in which a magnetic tape supplied from a supply reel is taken up by a take-up reel to drive the magnetic tape; a DC erasing head which is slidably in contact with said driving tape and which DC-magnetizes said servo band with imparting an azimuth relative to said servo band; and a servo signal writing head provided on a downstream of said DC erasing head in the driving direction of the magnetic tape, which is slidably in contact with said driving tape and which magnetizes the servo band by a magnetizing force having a component with a reverse magnetizing force relative to the magnetizing force of the DC erasing head in the lengthwise direction of the magnetic tape.

27 Claims, 8 Drawing Sheets

U.S. PATENT DOCUMENTS

2003/0054204 A1    3/2003   Kasuga et al.
2004/0120061 A1 *  6/2004   Yip et al. ..................... 360/48
2006/0158771 A1    7/2006   Nakao

* cited by examiner

SERVO WRITER AND SERVO WRITING PROCESS

This is a continuation of application Ser. No. 10/921,185 filed Aug. 19, 2004 now U.S. Pat. No. 7,142,388. The entire disclosure of the prior application, application Ser. No. 10/921,185 is hereby incorporated by reference.

BACKGROUND ARTS

1. Field of the Invention

The present invention relates to a servo writer and a servo writing process, and particularly to a servo writer and a servo writing process, which can magnetize a servo band of a magnetic tape depending upon the degree of the thickness of a magnetic layer, disclosure of which is based on Japanese Patent Application Number 2003-296343, filed on Aug. 20, 2003, which is incorporated herein by reference.

2. Description of Related Arts

In recent years, a magnetic recording medium has increasingly be able to recorded at higher density, for example, there exists a recording medium for backing up data for computer has a capacity as high as 100 Gigabytes. For this reason, several hundreds of data tracks are formed in a width direction in the magnetic tape. In this connect, the width of the data track becomes very narrow accordingly, and a space between neighboring data tracks also becomes very narrow. For this reason, a technique has been suggested in U.S. Pat. No. 5,689,384 where in order to trace the recording/reading element of the magnetic head on the data track, a servo signal has been written on a magnetic tape in advance, the position of a magnetic head (the position of the magnetic tape in the width direction) is servo-controlled, while reading the servo signal by the magnetic heat.

Figure 7A:
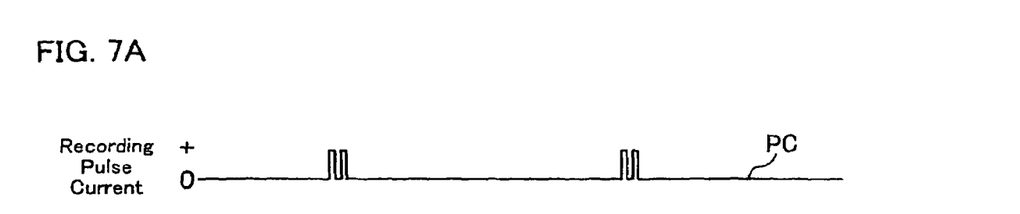
FIG. 7A shows a recording current at the time of writing the servo signal.
Figure 7B:
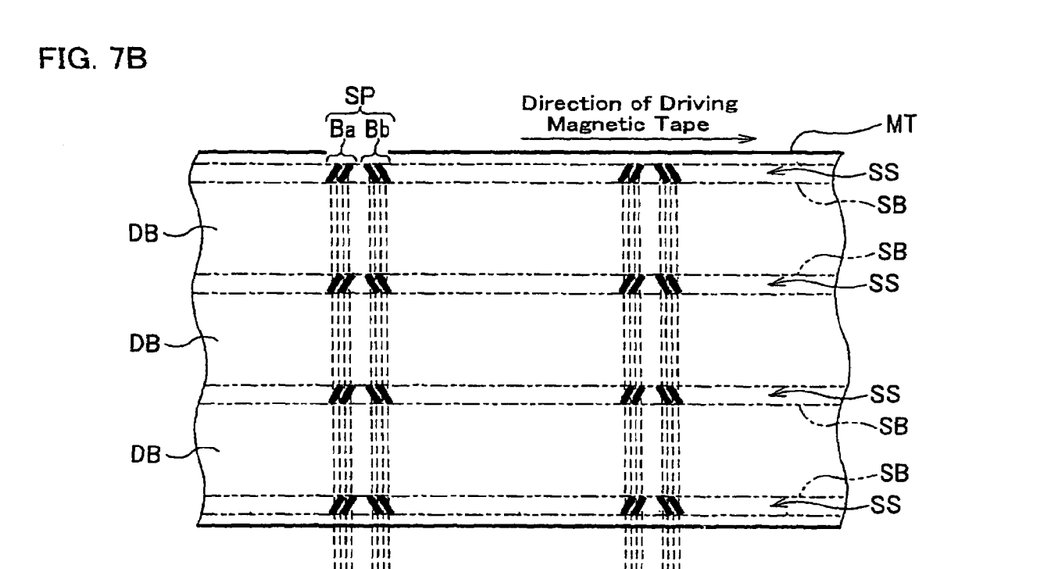
FIG. 7B is a plane view of the magnetic tape.

The servo signal as described above has hitherto been written on a servo band on a non-magnetized magnetic tape by applying a recording current to the magnetic head of the servo writer so as to be magnetized in one direction. Specifically, as shown in FIG. 7A, in order to record a servo band SS on the non-magnetized servo band SB, a recording pulse current PC comprising a zero current and a plus pulse current has hitherto been run. When such recording pulse current PC is used, the magnetic tape MT is not magnetized only within the region of servo pattern SP in the case of the zero current of the recording pulse current PC, and if the plus pulse current is run, the servo pattern SP is magnetized in one direction through a leaked magnetic flux from a servo gap of the magnetic head. As a result, the servo signal SS is written. Data band DB on which data signal is written is between the servo bands SB and SB.

The servo signal SS is composed so that one servo pattern SP is formed by burst Ba, which is a magnetized portion in a state of two stripes each having positive inclination angle relative to the driving direction (transferring direction), and the following burst Bb, which is a magnetized portion in a state of two stripes each having negative inclination angle relative to the driving direction, and such servo patterns SP are repeatedly formed in the lengthwise direction at prescribed intervals. In this prior art, while the servo pattern SP is composed of two stripes each positively and negatively inclining in this case, the construction of the servo pattern SP may be suitably modified. For example, it may be composed of five stripes each positively and negatively inclining, or five stripes each positively and negatively inclining and four stripes each positively and negatively inclining may be alternatively formed. For better understanding, the servo pattern SP is shown exaggeratedly relative to the magnetic tape MT in FIG. 7A.

Figure 7C:
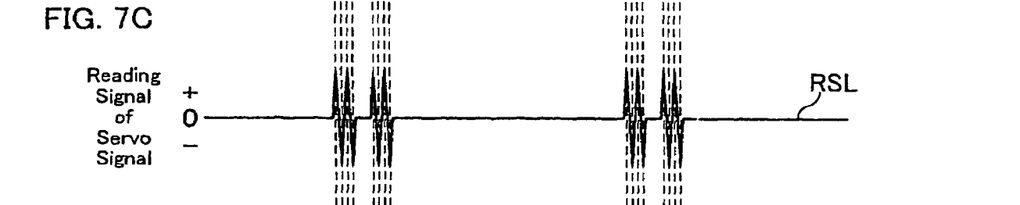
FIG. 7C is a drawing showing the recording signal of the servo signal where the recording element is wide.

On the other hand, in the device for recording/playing a magnetic tape the change in the magnetic field of the servo signal SS is detected by the change in the electric resistance through the servo signal reading element (MR element), and is outputted as a differential waveform (voltage value) as the reading signal. For this reason, as the change in the electric resistance of the MR element becomes large, the peak voltage value of the reading signal of the servo signal SS becomes large, enhancing an S/N ratio of the reading signal. Consequently, in the case where the change in the servo signal SS itself is large or in the case where the region to be read is large due to wide width of the servo signal reading element (MR element), the peak voltage value of the reading signal RSL of the servo signal becomes large as shown in FIG. 7C.

Figure 7D:
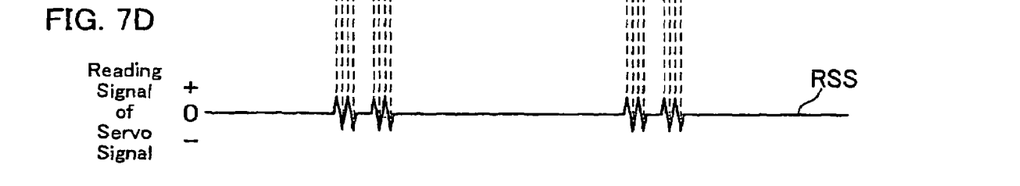
FIG. 7D is a drawing showing the recording signal of the servo signal where the recording element is narrow.

In the magnetic recording medium, it is expected that the recording capacity per one cartridge becomes much higher dense up to several terabytes. Consequently, the number of the data tracks in the magnetic tape is increased, the space between the neighboring data tracks becomes much more narrower, and the thickness of the magnetic tape becomes thinner. This decreases the magnetic amount, which can be detected at the time of reading the servo signal, and reduces the change in the magnetic amount of the servo signal SS, which can be detected by the servo signal reading element. Consequently, as shown in FIG. 7D, the peak voltage value of the reading signal RSS of the servo signal Ss becomes small, and the S/N ratio of the reading signal RSS is deteriorated. As a result, the recording/playing device of the magnetic tape cannot read the servo signal SS in a precise manner, and highly precise control of the position cannot be performed.

An object of the present invention is to provide a servo-writing process, which can magnetize a servo band of a magnetic tape depending upon the degree of the thickness of a magnetic layer.

SUMMARY OF THE INVENTION

A servo writer according to the present invention is a servo writer which writes a servo signal on a servo band of a magnetic tape, comprising a magnetic tape driving system in which a magnetic tape supplied from a supply reel is taken up by a take-up reel to drive the magnetic tape; a DC erasing head which is slidably in contact with said driving tape and which DC-magnetizes said servo band with imparting an azimuth relative to said servo band; and a servo signal writing head provided on a downstream of said DC erasing head in the driving direction of the magnetic tape, which is slidably in contact with said driving tape and which magnetizes the servo band by a magnetizing force having a component with a reverse magnetizing force relative to the magnetizing force of the DC erasing head in the lengthwise direction of the magnetic tape.

The present invention is also directed to a servo writing process, which writes a servo signal on a servo band of the magnetic tape, comprising:

DC-magnetizing a servo band by a DC erasing head having an azimuth relative to the lengthwise direction of said magnetic tape, and then magnetizing said servo band through a magnetizing force possessing a component with a reverse magnetizing force relative to the magnetizing force of the DC erasing head in the lengthwise direction of the magnetic tape to write the servo signal.

BRIEF DESCRIPTION OF THE DRAWINGS

FIGS. 7A, 7B. 7C and 7D are explanatory views showing the conventional magnetic tape having a servo signal, where

DESCRIPTION OF THE PREFERRED EMBODIMENTS

Figure 8A:
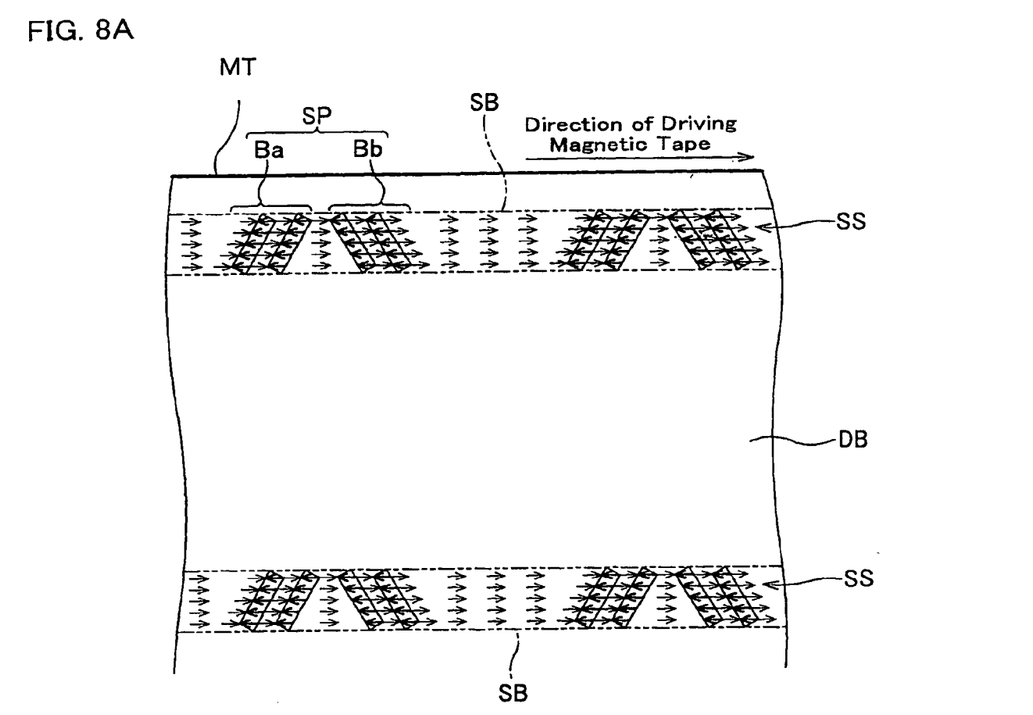
FIG. 8A is an enlarged plane view showing the magnetization states of the magnetic tape according to one embodiment.
Figure 8B:
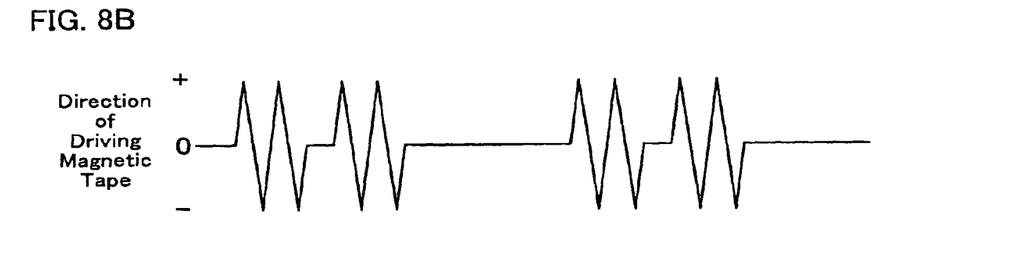
FIG. 8B shows a servo signal read out from the magnetic tape of FIG. 8A.

In order to attain the problem as described above, it can be considered that as suggested in our non-published patent application, after the servo band SB has been magnetized in one way in the lengthwise direction of the magnetic tape by a DC erasing head (not shown) (DC magnetization), the servo signal SS is magnetized in the reverse direction to be recorded (see FIG. 8A). In FIG. 8A, the magnetized direction is shown as a small arrow. Since the output (peak voltage value) where the servo signal reading element reads the servo signal SS depends upon the change ratio or change amount of switching between a portion where no signal is recorded and a portion where a signal is recorded, the magnetism direction is greatly changed from the normal direction to the reverse direction at the portion which switches from the base servo band SB having been magnetized in the normal direction into the servo pattern SP having been magnetized in the reverse direction. For this reason, as shown in FIG. 8B, the servo signal SS can be read out as a large output. Specifically, an S/N ratio of the servo signal SS can be enhanced.

However, since the degree of the thickness of the magnetic layer possessed by the magnetic tape is greatly different from each other depending upon the kinds of the magnetic tapes, when the servo signal is written by the same servo writer by a method just mentioned, the playing characteristics of the servo signal unduly become different depending upon the kinds of the products. For example, in the case of a thinner magnetic tape, even if good playing characteristics of the servo signal can be obtained, the playing characteristics of a thicker magnetic tape sometimes become poor. This is due to the fact that when the servo band is magnetized by the DC erasing head (not shown), irreverent to the degree of the thickness of the magnetic layer, the magnetization is carried out utilizing a constant current value. It is consumed that the servo signal is written with the same current value.

It may be considered that by the magnetization depending upon the thickness of the magnetic layer may be performed controlling the current value supplied to the DC erasing head. However, in this case, a new problem that a circuit for supplying a current to the DC erasing head becomes complicate is arisen.

Such a problem can be solved by a servo writer according to the present invention which writes a servo signal on a servo band of a magnetic tape, comprising a magnetic tape driving system in which a magnetic tape supplied from a supply reel is taken up by a take-up reel to drive the magnetic tape; a DC erasing head which is slidably in contact with said driving tape and which DC-magnetizes said servo band with imparting an azimuth relative to said servo band; and a servo signal writing head provided on a downstream of said DC erasing head in the driving direction of the magnetic tape, which is slidably in contact with said driving tape and which magnetizes the servo band by a magnetizing force having a component with a reverse magnetizing force relative to the magnetizing force of the DC erasing head in the lengthwise direction of the magnetic tape.

First Embodiment

The first embodiment of the servo writer according to the present invention will now be described by referring to the attached drawings. The servo writer according to the present invention is characterized in that an azimuth of a DC erasing head contained in the servo writer is adjustable. The term "azimuth relative to the servo band" used herein means an angle of magnetic gap of the magnetic head relative to the orthogonal direction of the servo band.

The construction of the servo writer according to the present invention will now be described. It is noted that the servo writer is a device which is used in a stage for writing a servo signal onto a magnetic tape.

Figure 1:
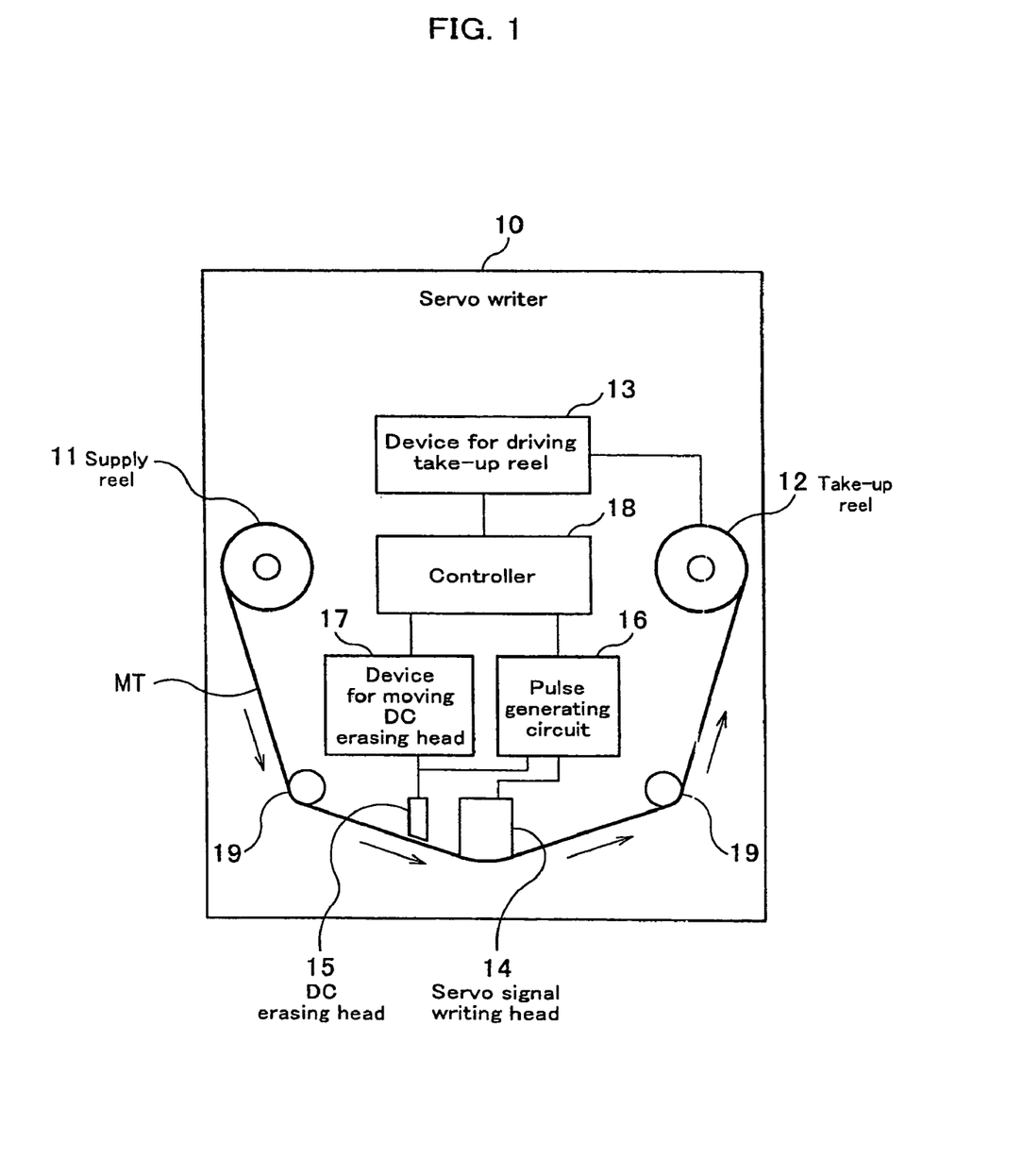
FIG. 1 is a constructional view schematically showing the first embodiment of the servo writer according to the present invention.

A servo writer 10 shown in FIG. 10 mainly comprises a supply reel 11, a take-up reel 12, a device 13 for driving take-up reel, a servo signal writing head 14, a DC erasing head 15, a pulse generating circuit 16, a device 17 for moving DC erasing head, a controller 18, and a plurality of guides 19. The servo writer also possesses a power device, a verifying device for inspecting the servo signal written by the servo signal writing head 14 (not shown) and other devices. The supply reel 11, the take-up reel 12, the device 13 for driving take-up reel and the guides 19 correspond to the magnetic tape driving system. The details of each portions of the servo writer 10 will be described.

In the supply reel 11, a magnetic tape MT cut into a product width from the wide web material wound around a pancake having a large diameter is set. The supply reel 11 supplies the magnetic tape MT at the time of writing a servo signal. The magnetic tape MT supplied from the supply reel 11 is guided by the guides 19 to the servo signal writing head 14 and the DC erasing head 15, after which it is taken up by the take-up reel 12. The supply reel 11 is rotatably driven by the device 13 for driving take-up reel.

The device 13 for driving take-up reel is a device, which rotatably drives the take-up reel 12, and comprises a motor, a circuit for driving motor, which supplies a current to the motor, a gear for connecting the shaft of the motor to the take-up reel 12 and the like (not shown). The device 13 for driving take-up reel generates a motor current by the circuit for driving motor based on a motor current signal inputted from the controller 18, supplies the motor current to the motor, and transmits the rotational driving force to the take-up reel 12 via the gear to thereby rotatably drive the take-up reel.

Figure 2:
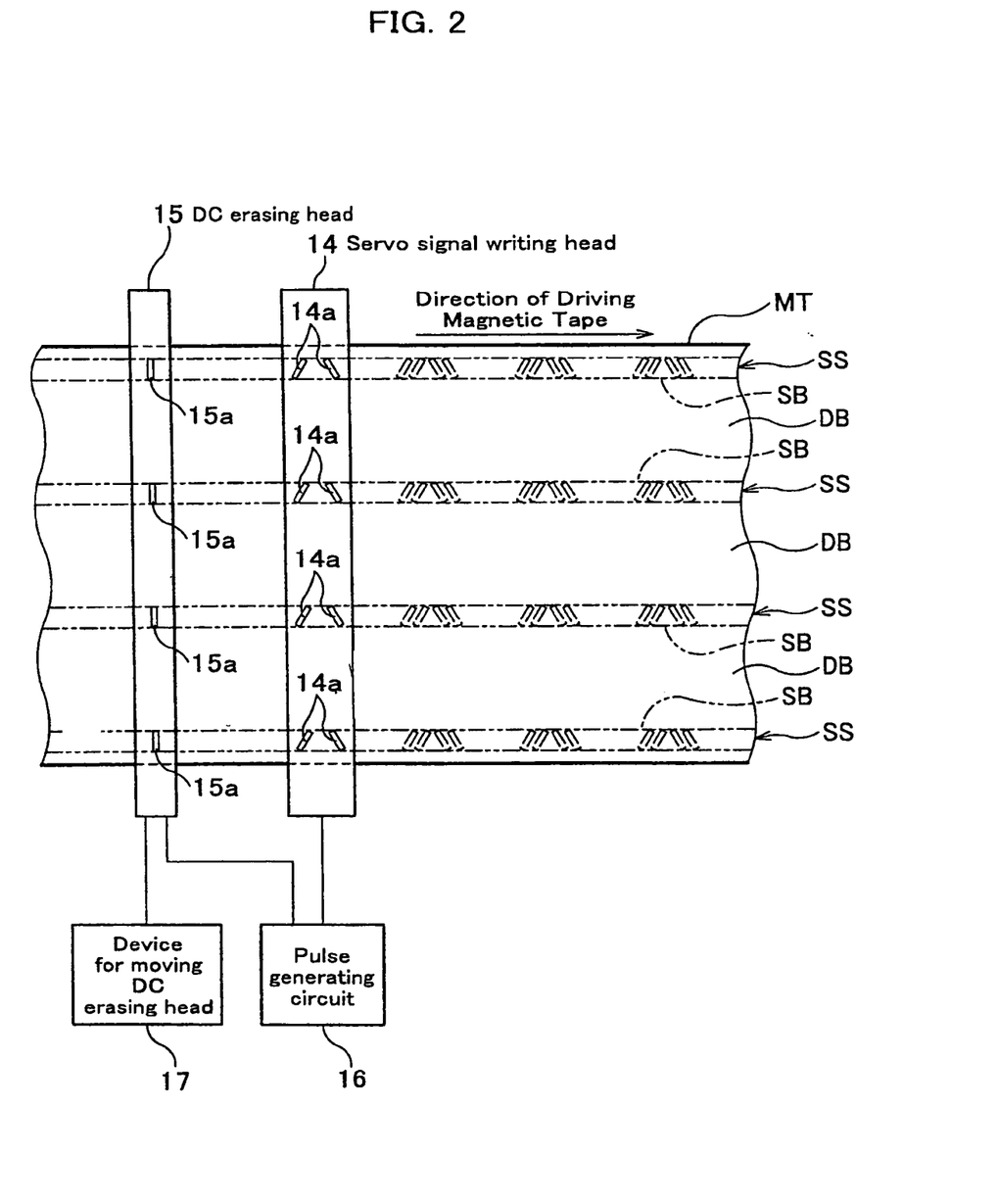
FIG. 2 is a plane view showing a servo signal writing head and DC erasing head included in the servo writer.

The servo signal writing head 14 is a magnetic head for writing the servo signal SS onto the magnetic tape MT, and comprises a coil (not shown) for generating a magnetic flux, and four head gaps 14*a*, 14*a*, 14*a*, and 14*a* aligned in one line corresponding to the positions of four servo bands SB, SB, SB, SB, of the magnetic tape in the width direction (see FIG. 2). Head gaps 14*a* are formed into non-parallel shape (none-connecting V-shape) having a prescribed angle relative to the lengthwise direction of the magnetic tape MT (driving direction). The head gaps 14*a* are formed by a lithography to which a semiconductor technique is applied. When a recording pulse current is supplied from the pulse generation circuit 16, the servo signal writing head 14 magnetizes the magnetic layer of the magnetic tape MT by the leakage magnetic flux from the head gaps 14*a* to write the servo signal SS. At this time, the servo signal SS is written along with the driving direction of the magnetic tape MT.

The DC erasing head 15 is a magnetic head for magnetizing the magnetic tape MT in the normal direction (DC magnetization), and is provided on an upstream of the servo signal writing head 14. The DC erasing head 15 comprises a coil (not shown) for generating a magnetic flux, and four head gaps 15*a*, 15*a*, 15*a*, and 15*a* aligned in one line corresponding to the positions of four servo bands SB, SB, SB, SB, of the magnetic tape in the width direction (see FIG. 2). Head gaps 15*a* are formed into an I shape in the width direction of the magnetic tape. The head gaps 15*a* are formed by a lithography to which a semiconductor technique is applied. When a magnetism-erasing pulse signal is supplied from the pulse generation circuit 16, the DC erasing head 15 magnetizes the magnetic tape MT in the normal direction (driving direction of the magnetic tape MT) by the leakage magnetic flux from the head gaps 15*a* (see FIG. 3).

Figure 8C:
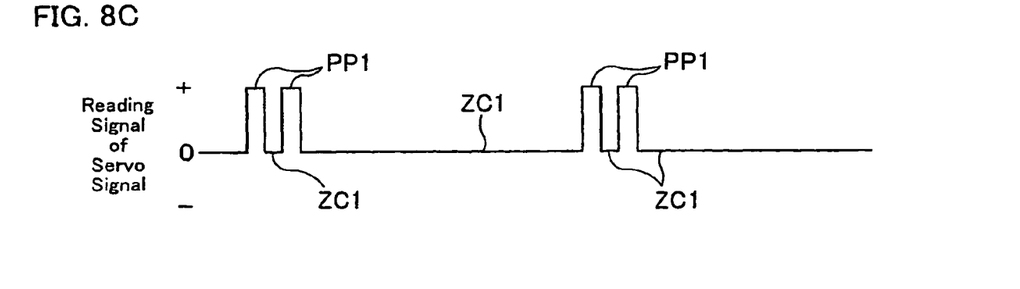
FIG. 8C shows a signal at the time of writing the servo signal.

The pulse generating circuit 16 is a circuit for supplying a recording pulse current PC, which is a signal for writing a servo pattern to the servo signal writing head 14 at the time of writing the servo signal (see FIG. 8C). Also, the pulse generating circuit 16 is a circuit for continuously applying a magnetism erasing signal to the DC erasing head 14 at the time of writing the servo signal.

Referring to FIG. 8C, the pulse generating circuit 16 repeats a pattern where a plus pulse signal PP1, which is a plus polarity, zero current ZC1, plus pulse signal PP1, and zero current ZC1 are continuously generated on this order, and then no current is generated for a prescribed period (zero current ZC1) to generate the recording pulse current PC based on the pulse control signal inputted from the controller 18. Then, the pulse generating circuit 16 supplies the recording pulse current PC to the coil (not shown) of the servo signal writing head 14.

The current value of the plus pulse current PP1 is a current sufficient for magnetizing the magnetic layer of the magnetic tape MT by the leakage magnetic flux from the head gaps 14*a*, and is set considering the characteristics of the coil of the servo signal writing head 14 and the like. The width (period) of the plus pulse current PP1 may define a prescribed width of the servo pattern SP in the lengthwise direction, and is set considering the driving speed of the magnetic tape MT, shape of the head gap 14*a* and the like. The prescribed period of the zero current ZC1 may define a prescribed interval for forming the servo pattern SP described above, and is set considering the driving speed of the magnetic tape MT and the like.

The device 17 for moving DC erasing head is a device for changing the azimuth of the DC erasing head 15. In this embodiment, as the device 17 for moving DC erasing head, a piezo-electric element is used. The device 17 for moving DC erasing head changes the azimuth of the DC erasing head 15 at the time of writing the servo signal SS based on the control signal of the head moving device (see FIG. 4). The term "azimuth" intended herein is an angle of the servo band SB of the magnetic tape MT and the head gap 15*a* of the DC erasing head 15. Specifically, θ in FIG. 4 is azimuth.

Figure 4:
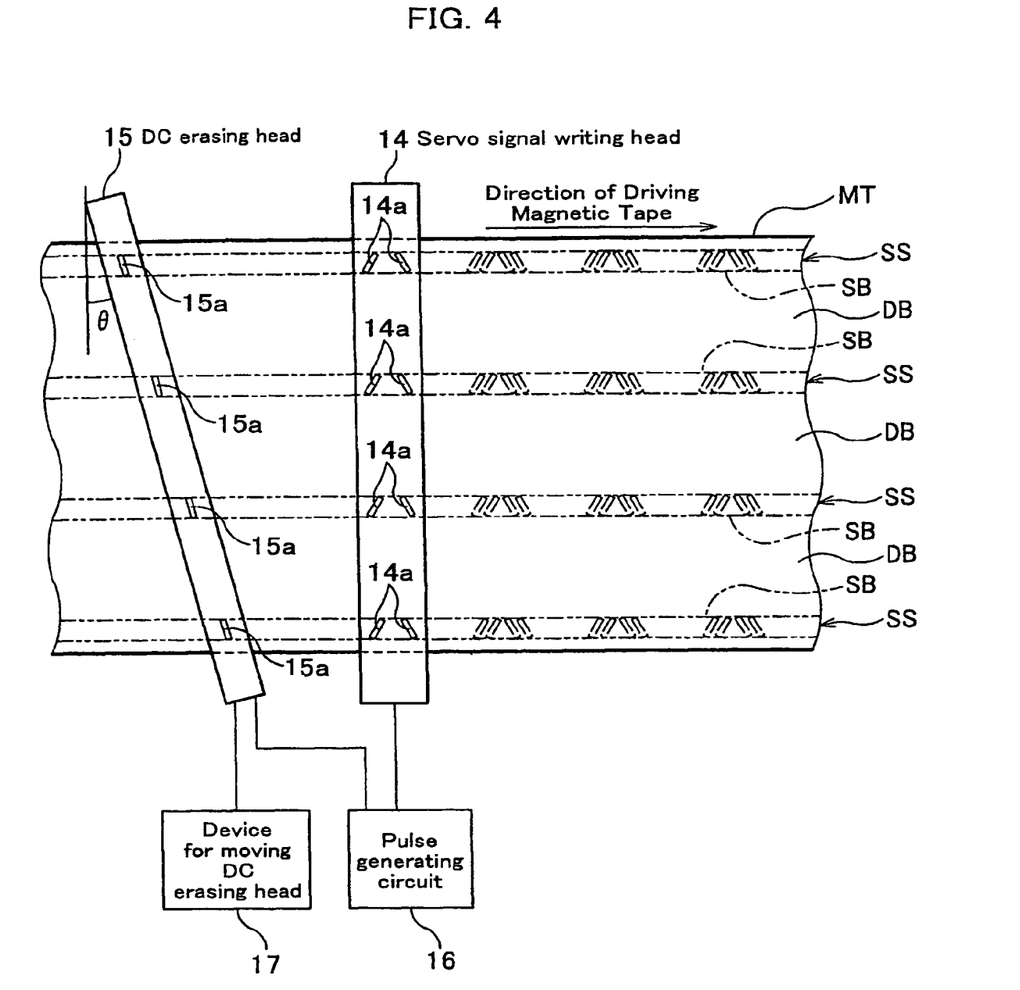
FIG. 4 is a drawing showing the situation that the azimuth of the DC erasing head is changed.
Figure 5A:
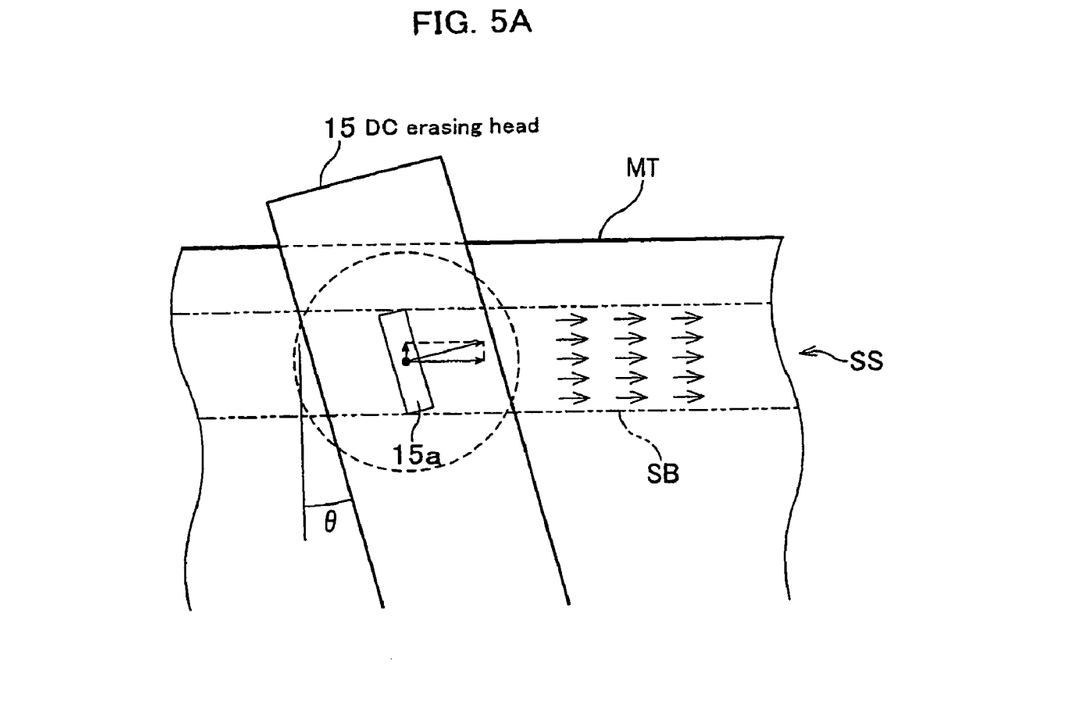
FIG. 5A is a partially enlarged drawing of FIG. 4.
Figure 5B:
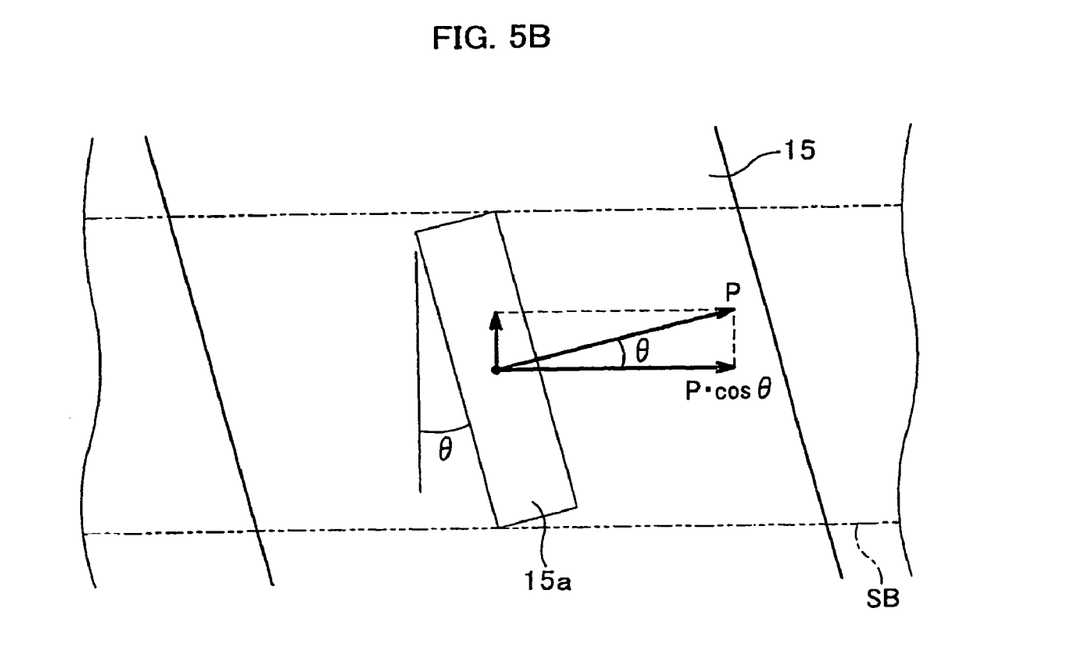
FIG. 5B is a enlarged view of FIG. 5A which enlarges the portion sup rounded by a broken line.

As shown in FIG. 4, when the azimuth of the DC erasing head 15 is changed, the force for magnetizing the magnetic tape MT possessed by head gap 15*a* of the DC erasing head 15 (hereinafter referred to as "magnetizing force") is decreased. Specifically, taking the original magnetizing force as P (see FIG. 5), in the case where the azimuth is θ, the component directed towards one direction of the lengthwise direction of the tape amongst the magnetizing force of the head gap 15*a* is P×cos θ (see FIG. 5B). Specifically, when the azimuth is θ, the magnetizing force of the head gap 15*a* becomes lower than the case where the azimuth is 0°.

The controller 18 is a device for controlling actuation of each part of the servo writer 10, and comprises CUP (central processing unit), various storage devices, and the like. The controller 18 produces a motor current signal for controlling the motor current of the take-up reel 13 in order to keep the driving speed of the magnetic tape MT at the time of writing the servo signal, which is sent to the device 13 for driving take-up reel. The controller 18 also produces the magnetism erasing signal for magnetizing (or erasing the magnetism of) the magnetic layer of the magnetic tape MT at the time of writing the servo signal, which is sent to the DC erasing head 15.

In order to set the width of the servo pattern SP and the servo signal SS in which the prescribed interval for forming the servo pattern SP, the controller 18 produces a pulse control signal for controlling the current value of the plus pulse current PPC of the recording pulse current PC, the width of the pulse and the generation timing, which is sent to the pulse generation circuit 16. Specifically, the controller 18 produces the pulse pattern of the plus pulse current PP1→zero current ZC1→the plus pulse current PP1→zero current ZC1.

The controller 18 also produces a control signal for the device for moving DC erasing head in order to change the azimuth θ of the head gap 15*a* of the DC erasing had 15, which is sent to the device 17 for moving DC erasing head.

Next, a process for writing a servo signal onto the magnetic tape MT utilizing the servo writer 10 composed as described above (servo writing process) will now be described.

The magnetic tape MT in the pancake state is set on the supply reel 11 of the servo writer 10, and the edge of the magnetic tape MT is connected to the core of the take-up reel 12. The magnetic tape MT is taken up by the take-up reel 13 driven by the device 13 for driving take-up reel, while being guided by the guides 19 or such whereby the magnetic tape is run.

Figure 3:
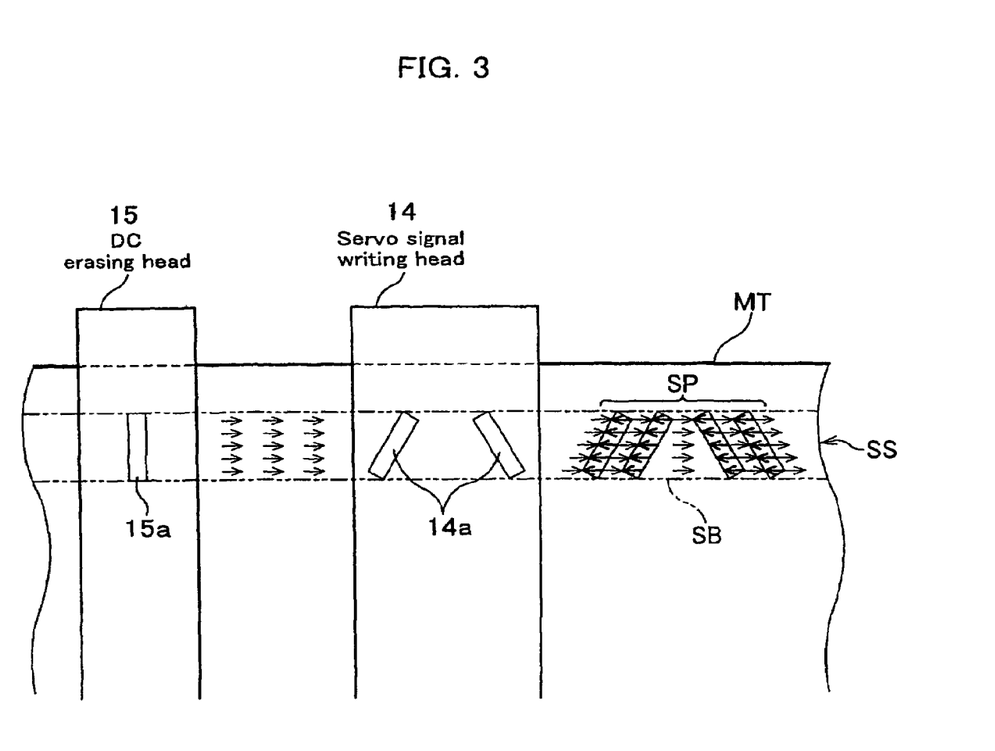
FIG. 3 is an enlarged view of FIG. 2.

Next, the portion of the servo band SB of the magnetic tape MT is magnetized by the DC erasing head 15 (see FIG. 3). At this time, by means of the device 17 for moving DC erasing head, the azimuth θ of the DC erasing had 15 is changed to adjust the magnetizing force. As described above, the azimuth of the DC erasing head 15 is changed by the device 17 for moving DC erasing head depending upon the degree of the thickness of the magnetic layer of the magnetic tape, whereby the serve band SB can be magnetized depending upon the degree of the thickness of the magnetic layer of the magnetic tape.

Then, the servo band SB having been magnetized in the normal direction is magnetized in the reverse direction by means of the pulse generating circuit 16 to write the servo signal SS (see FIG. 3). As a result, the servo pattern SP having been magnetized in the reverse direction is formed on the base servo band SB having been magnetized in the normal direction of the magnetic tape MT.

The magnetic tape MT having the servo signal written thereon is taken up by the take-up reel 12 depending upon the specification of the product, and then stored in a cartridge case (not shown).

As described above, according to the servo writer 10, the azimuth of the DC erasing head 15 can be changed depending upon the thickness of the magnetic layer of the magnetic tape MT by the device 17 for moving DC erasing head, whereby the magnetizing force of the servo band SB by means of the DC erasing head can be adjusted. What is more, according to the servo writer 10, since the magnetizing force of the servo band SB is adjusted by changing the azimuth of the DC erasing head 15, the current value running through the DC erasing head 15 may be constant value. Consequently, there arises no problem in terms of complication of the circuit for supplying current to the DC erasing head 15.

Second Embodiment

Second embodiment of the servo writer according to the present invention will now be described. Since this embodiment modifies the servo writer according to the first embodiment, the constitution elements similar to those of the first embodiment are assigned to the same numerical or symbols, the description thereof will be omitted.

Figure 6:
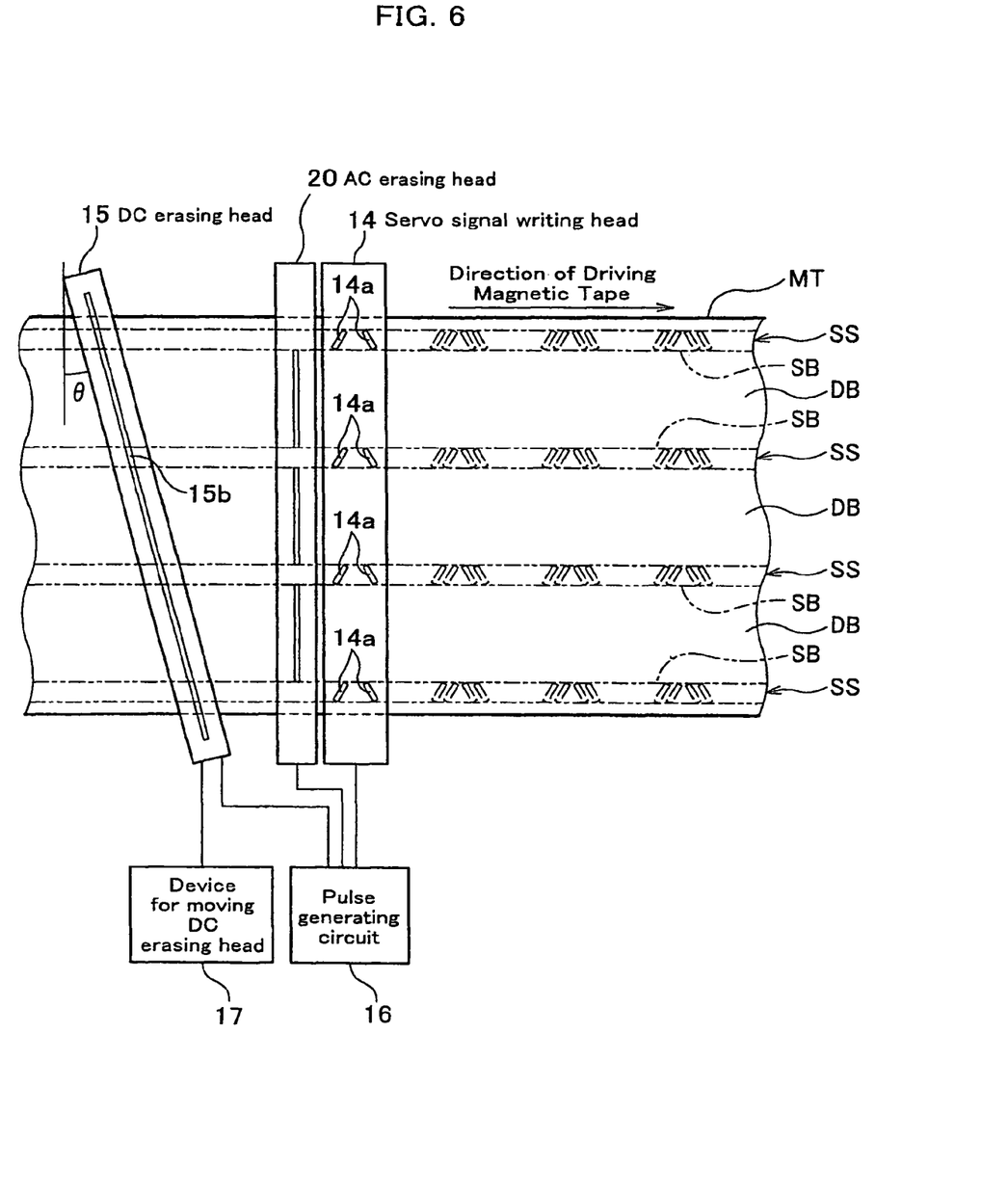
FIG. 6 is a constructional view schematically showing the second embodiment of the servo writer according to the present invention.

As shown in FIG. 6, head gaps 15*b* are formed on the DC erasing head so that they project prescribed length on both ends of the magnetic tape MT in the width direction in order to cover the whole of the magnetic tape MT in the width direction. Specifically, the head gaps 15*b* are formed into a length so as to cover each of the servo bands SB even if the DC erasing head 15 is rotated up to the maximum azimuth, which has been predetermined.

Between the DC erasing head 15 and the servo signal writing head 14, an AC erasing head 20, which AC magnetizes the data band DB positioned between the servo bands SB (magnetization at random in one direction and the other direction of the lengthwise direction of the tape) is provided. The AC erasing head 20 may be provided on a downstream of the DC erasing head 15, for example, may be provided on a downstream of the servo signal writing head 14.

Next, a process for writing a servo signal onto the magnetic tape MT utilizing the servo writer 10 composed as described above (servo writing process) will now be described.

First, the DC erasing head 15 is rotated by the device 17 for moving DC erasing head until the azimuth becomes a prescribed value. At this time, since the head gap 15*b* of the DC erasing head 15 is formed in a length which covers each servo band SB even when the DC erasing head 15 is rotated to be the maximum azimuth, it can be securely in contact with the whole of each servo band SB.

When the alignment of the DC erasing head 15 has been completed, the magnetic tape MT is driven by driving the device 13 for driving take-up reel and the whole of the magnetic tape MT is magnetized in the normal direction by the DC erasing head 15. Subsequently, the data band DB having been magnetized in the normal direction is AC magnetized by the AC erasing head 20, and the servo band SB having been magnetized in the normal direction is magnetized in the reverse direction by the servo band writing head 13 to write the servo signal SS.

According to the second embodiment described above, even if the DC erasing head 15 is largely rotated by the device 17 for moving DC erasing head, since head gap 15*b* of the DC erasing head 15 is not out of the servo band SB, the azimuth can be greatly changed to largely change the component of the magnetizing forcer in the lengthwise direction of the tape.

While the embodiments of the present invention have been described, it should be noted that the present invention is not restricted to these embodiments and various modification and alternation can be made without departing from the sprits and the scope of the present invention.

For example, the recording current in the embodiments comprises a pulse current in which pulse currents having a plus polarity and zero currents are alternatively repeated, the pattern of the pulse current should not be restricted thereto. For example, a pulse current in which pulse currents having a minus polarity and zero currents are alternatively repeated, the pattern of the pulse current may be used.

In these embodiments, whereas the base portion of the servo band is magnetized in the normal direction and the portion of the servo signal is magnetized in the reverse direction, the base portion of the servo band may be magnetized in the reverse direction and the portion of the servo signal may be magnetized in the normal direction.

Also, whereas the embodiments are composed so that the magnetism of the servo signal writing head is reverse relative to the component of the magnetizing force of the magnetic tape in the lengthwise direction of the magnetic tape, the present invention is not restricted thereto. The magnetizing force of the servo signal writing head may be any direction as long as it possesses a component which is the reverse direction relative to the magnetizing force of the magnetic tape in the lengthwise direction of the magnetic tape.

What is claimed is:

1. A servo writer, which writes a servo signal on a servo band of a magnetic tape, comprising
    a magnetic tape driving system in which a magnetic tape supplied from a supply reel is taken up by a take-up reel to drive the magnetic tape;
    a DC erasing head which is slidably in contact with said driving tape and which DC-magnetizes said servo band and has an azimuth relative to said servo band; and
    a servo signal writing head provided on a downstream of said DC erasing head in the driving direction of the magnetic tape, which is slidably in contact with said driving tape and which magnetizes the servo band by a magnetizing force having a component with a reverse magnetizing force relative to the magnetizing force of the DC erasing head in the lengthwise direction of the magnetic tape; wherein
    the DC erasing head has an azimuth relative to said servo band so as to exert a smaller magnetic force in the running direction of the magnetic tape under a certain current input than a magnetic force obtained when the DC erasing head is transversally positioned relative to the running direction of the magnetic tape under the same current input.

2. The servo writer according to claim 1, which further comprises a device for moving the DC erasing head, which changes the azimuth of the DC erasing head.

3. The servo writer according to claim 2, wherein a head gap of said DC erasing head is formed over the whole of the magnetic tape in the width direction, and which further comprises an AC erasing head for AC magnetizing the data band positioned between the servo bands, provided on a downstream of the DC erasing head.

4. The servo writer according to claim 3, wherein said device for moving DC erasing head utilizes a piezo-electric element.

5. The servo writer according to claim 2, wherein said servo signal writing head comprises a coil for generating a magnetic flux, and a plurality of head gaps aligned in one line corresponding to the positions of said plurality of servo bands of the magnetic tape in the width direction.

6. The servo writer according to claim 5, wherein said DC erasing head comprises a coil for generating a magnetic flux, and a plurality of head gaps in one line corresponding to the positions of said plurality of servo bands of the magnetic tape in the width direction.

7. The servo writer according to claim 6, wherein said device for moving DC erasing head utilizes a piezo-electric element.

8. The servo writer according to claim 7, which comprises a pulse generation circuit which repeats a pattern where plus pulse current, a zero current, a plus pulse current, a zero current are continuously generated, and then no current is generated.

9. The servo writer according to claim 5, wherein said device for moving DC erasing head utilizes a piezo-electric element.

10. The servo writer according to claim 2, wherein said DC erasing head comprises a coil for generating a magnetic flux, and a plurality of head gaps in one line corresponding to the positions of said plurality of servo bands of the magnetic tape in the width direction.

11. The servo writer according to claim 10, wherein said device for moving DC erasing head utilizes a piezo-electric element.

12. The servo writer according to claim 2, wherein said device for moving DC erasing head utilizes a piezo-electric element.

13. The servo writer according to claim 1, wherein a head gap of said DC erasing head is formed over the whole of the magnetic tape in the width direction, and which further comprises an AC erasing head for AC magnetizing the data band positioned between the servo bands, provided on a downstream of the DC erasing head.

14. The servo writer according to claim 1, wherein said servo signal writing head comprises a coil for generating a magnetic flux, and a plurality of head gaps aligned in one line corresponding to the positions of said plurality of servo bands of the magnetic tape in the width direction.

15. The servo writer according to claim 14, wherein said DC erasing head comprises a coil for generating a magnetic flux, and a plurality of head gaps in one line corresponding to the positions of said plurality of servo bands of the magnetic tape in the width direction.

16. The servo writer according to claim 1, wherein said DC erasing head comprises a coil for generating a magnetic flux, and a plurality of head gaps in one line corresponding to the positions of said plurality of servo bands of the magnetic tape in the width direction.

17. The servo writer according to claim 1, which comprises a pulse generation circuit which repeats a pattern where plus pulse current, a zero current, a plus pulse current, a zero current are continuously generated, and then no current is generated.

18. The servo writer according to claim 1, which comprises a pulse generation circuit which repeats a pattern where minus pulse current, a zero current, a minus pulse current, a zero current are continuously generated, and then no current is generated.

19. The servo writer according to claim 1, further comprising a power circuit, a control circuit, and a verification circuit for inspecting said servo signal.

20. The servo writer according to claim 19, wherein said control circuit controls said azimuth of said DC erasing head.

21. The servo writer according to claim 1, wherein a plane of the azimuth is parallel to a plane of the magnetic tape.

22. The servo writer according to claim 21, further comprising a device for moving the DC erasing head, which changes the azimuth of the DC erasing head, wherein the plane of the azimuth remains parallel to the plane of the magnetic tape.

23. A servo writing process, which writes a servo signal on a servo band of the magnetic tape, comprising:
    DC-magnetizing a servo band by a DC erasing head having an azimuth relative to the lengthwise direction of said magnetic tape, and then
    magnetizing said servo band through a magnetizing force possessing a component with a reverse magnetizing force relative to the magnetizing force of the DC erasing head in the lengthwise direction of the magnetic tape to write the servo signal; wherein
    the DC erasing head has an azimuth relative to said servo band so as to exert a smaller magnetic force in the running direction of the magnetic tape under a certain current input than a magnetic force obtained when the DC erasing head is transversally positioned relative to the running direction of the magnetic tape under the same current input.

24. A servo writing process according to claim 23, wherein the whole of said magnetic tape is DC magnetized in DC magnetizing said servo band, and which further comprises AC magnetizing the data band between said servo bands by an AC erasing head.

25. The servo writing process according to claim 23, further comprising controlling the azimuth of said DC erasing head by a control circuit.

26. The servo writing process according to claim 23, wherein a plane of the azimuth is parallel to a plane of the magnetic tape.

27. The servo writing process according to claim 26, further comprising changing the azimuth of the DC erasing head, while the plane of the azimuth remains parallel to the plane of the magnetic tape, before the DC magnetizing step.

* * * * *